United States Patent
Tsukui et al.

(10) Patent No.: US 11,072,856 B2
(45) Date of Patent: Jul. 27, 2021

(54) VAPOR PHASE GROWTH METHOD

(71) Applicant: NuFlare Technology, Inc., Kanagawa (JP)

(72) Inventors: Masayuki Tsukui, Yokohama (JP); Hajime Nago, Yokohama (JP); Yasushi Iyechika, Matsudo (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 16/288,244

(22) Filed: Feb. 28, 2019

(65) Prior Publication Data

US 2019/0271072 A1 Sep. 5, 2019

(30) Foreign Application Priority Data

Mar. 1, 2018 (JP) .............................. JP2018-036381

(51) Int. Cl.
| | |
|---|---|
| *C23C 16/30* | (2006.01) |
| *C23C 16/455* | (2006.01) |
| *C30B 29/40* | (2006.01) |
| *H01L 21/02* | (2006.01) |
| *C30B 25/02* | (2006.01) |
| *C23C 16/458* | (2006.01) |

(52) U.S. Cl.
CPC ........ *C23C 16/303* (2013.01); *C23C 16/4584* (2013.01); *C23C 16/45561* (2013.01); *C23C 16/45565* (2013.01); *C30B 25/02* (2013.01); *C30B 29/406* (2013.01); *H01L 21/0254* (2013.01); *H01L 21/0262* (2013.01)

(58) Field of Classification Search
None
See application file for complete search history.

(56) References Cited

U.S. PATENT DOCUMENTS 5,512,320 A * 4/1996 Turner .................. C03C 17/001
                                                  118/719
8,890,208 B2   11/2014 Miyoshi
9,869,035 B2    1/2018 Yamada
(Continued)

FOREIGN PATENT DOCUMENTS

| CN | 101981658 A | 2/2011 |
| JP | 2005232432 A | 9/2005 |

(Continued)

OTHER PUBLICATIONS

Office Action dated Oct. 25, 2019 for the corresponding Taiwanese Patent Application No. 108106383 and machine English translation thereof.

(Continued)

*Primary Examiner* — Anthony Ho
*Assistant Examiner* — Kevin Quinto
(74) *Attorney, Agent, or Firm* — Rankin, Hill & Clark LLP (57) ABSTRACT

Provided is a vapor phase growth method according to an embodiment including loading a first substrate into a reaction chamber, generating a first mixed gas by mixing an indium containing gas, an aluminum containing gas, and a nitrogen compound containing gas, and forming a first indium aluminum nitride film on the first substrate by supplying the first mixed gas into the reaction chamber, the first substrate being rotated at a first rotation speed of 300 rpm or more.

8 Claims, 4 Drawing Sheets

(56) References Cited

U.S. PATENT DOCUMENTS

| | | | |
|---|---|---|---|
| 2002/0127852 A1* | 9/2002 | Kawakami | C23C 16/54 |
| | | | 438/680 |
| 2010/0143588 A1 | 6/2010 | Belousov | |
| 2011/0024795 A1 | 2/2011 | Miyoshi | |
| 2012/0258580 A1 | 10/2012 | Brown | |
| 2013/0084391 A1* | 4/2013 | Lee | C23C 16/45572 |
| | | | 427/255.5 |
| 2013/0244410 A1* | 9/2013 | Arena | H01L 21/0242 |
| | | | 438/503 |
| 2014/0273518 A1* | 9/2014 | Rogers | H01L 21/3211 |
| | | | 438/776 |
| 2018/0057938 A1 | 3/2018 | Takahashi | |

FOREIGN PATENT DOCUMENTS

| | | |
|---|---|---|
| JP | 2013207019 A | 10/2013 |
| JP | 2018037456 A | 3/2018 |
| TW | I261689 B | 9/2006 |
| TW | 201237942 A | 9/2012 |

OTHER PUBLICATIONS

S. Guo et al. "AlInN HEMT grown on SiC by metalorganic vapor phase epitaxy for millimeter-wave applications", Phy. Status Solidi, 2010, pp. 1348-1352, vol. A 207 No. 6, Wiley-VCH, Weinheim, Germany.

J. Lu et al. "Epitaxial Growth of inAlN/GaN Heterostructures on Silicon Substrates in a Single Wafer Rotating Disk MOCVD Reactor", MRS Advances, 2017, pp. 329-334, Materials Research Society, Warrendale, PA; Cited in Specification.

S. Choi- et al. "Origins of unintentional incorporation of gallium in AlInN layers during epitaxial growth, part I: Growth of AlInN on AlN and effects of prior coating", Journal of Crystal Growth, 2014, pp. 137-142, vol. 388, Elsevier B.V., Amsterdam, Netherlands.

Taiwanese Office Action dated Nov. 10, 2020 issued in the corresponding TW108106383 and its English machine translation.

* cited by examiner

VAPOR PHASE GROWTH METHOD

CROSS-REFERENCE TO RELATED APPLICATION

This application is based upon and claims the benefit of priority from Japanese Patent Applications No. 2018-036381, filed on Mar. 1, 2018, the entire contents of which are incorporated herein by reference.

FIELD OF THE INVENTION

The present invention relates to a vapor phase growth method of supplying a gas to form a film on a substrate.

BACKGROUND OF THE INVENTION

A high electron mobility transistor (HEMT) using GaN based semiconductor realizes a high breakdown voltage and low ON resistance. In the HEMT, a two-dimensional electron gas (2DEG) induced in a heterointerface between a channel layer and a barrier layer stacked is used as a current path.

For example, gallium nitride (hereinafter, also referred to as GaN) is used for the channel layer, and aluminum gallium nitride (hereinafter, also referred to as AlGaN) is used for the barrier layer. It has been studied to apply indium aluminum nitride (hereinafter, also referred to as InAlN) instead of the aluminum gallium nitride for the barrier layer.

Since the InAlN has large spontaneous polarization, the 2DEG concentration at the interface between the InAlN and the GaN can be increased. Therefore, the HEMT with low ON resistance can be realized. In addition, lattice matching with the GaN can be realized by setting the In composition in the InAlN (In/(In+Al)) to about 17 atom %. Therefore, distortion due to lattice mismatching disappears, and thus, the reliability of the HEMT improves.

In addition, the stacked structure of the InAlN film and the GaN film is expected to be applied to a dielectric mirror used for a surface emitting laser or the like. With respect to the application to the above-mentioned dielectric mirror, it is required that the interface between the GaN film and the InAlN film is abrupt, that is, the composition of the compound of the above two films sharply changes.

However, in the vapor phase growth of the InAlN film, unintentional Ga incorporation into the InAlN film is a problem. If the gallium is incorporated into the InAlN film, for example, there is a concern that the 2DEG density at the interface between the InAlN and the GaN decreases and the electron mobility decreases. In addition, since sharp changes in the composition of the compound cannot be obtained, it is difficult to form a good dielectric mirror.

As a cause of the occurrence of unintentional Ga incorporation into the InAlN film, it is considered that deposits containing Ga are generated in the upstream portion of the growth apparatus during the growth of the film containing Ga performed before the growth of the InAlN film, Ga is ejected into the growth atmosphere during the growth of the InAlN film from the deposits containing Ga, and the Ga is incorporated into the InAlN film.

Figure 1:
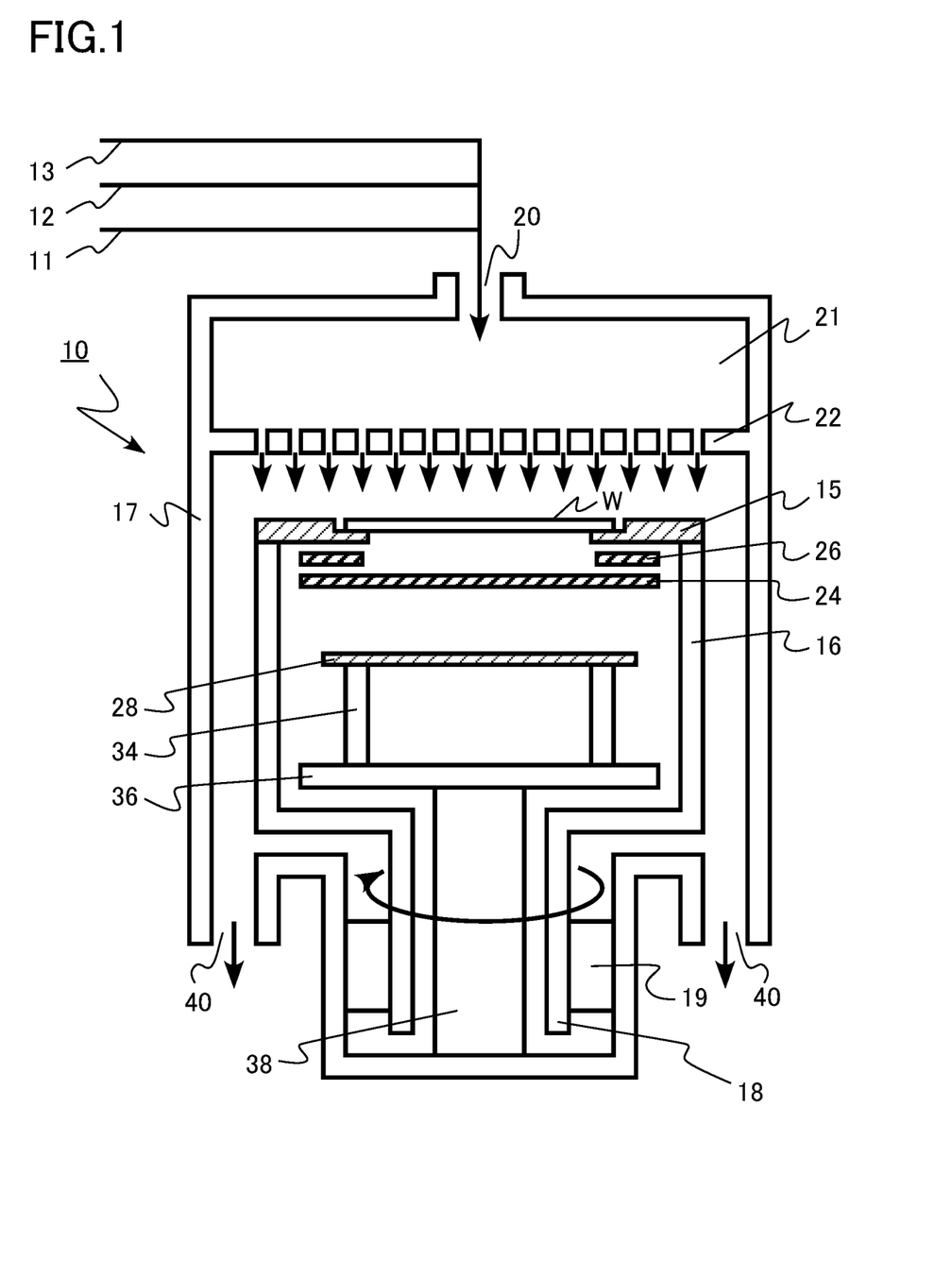
FIG. 1 is a schematic sectional view of a vapor phase growth apparatus used in a vapor phase growth method according to a first embodiment.

J. Lu et al., MRS Advances, 2017.174, pp 329, discloses an InAlN film which is formed using an apparatus for supplying a separation gas as illustrated in FIG. 1 (b) of J. Lu et al. and in which unintentional gallium incorporation is suppressed.

SUMMARY OF THE INVENTION

According to an aspect of the invention, there is provided a vapor phase growth method including: loading a first substrate into a reaction chamber; generating a first mixed gas by mixing an indium containing gas, an aluminum containing gas, and a nitrogen compound containing gas; and forming a first indium aluminum nitride film on the first substrate by supplying the first mixed gas into the reaction chamber, the first substrate being rotated at a first rotation speed of 300 rpm or more.

DETAILED DESCRIPTION OF THE EMBODIMENTS

Hereinafter, embodiments of the invention will be described with reference to the drawings.

In this specification, in some cases, the same or similar components are denoted by the same reference numerals.

In this specification, the direction of gravity in a state where the vapor phase growth apparatus is installed so as to be capable of forming a film is defined as "down", and the opposite direction is defined as "up". Therefore, "below" denotes a position in the direction of gravity with respect to the reference, "downward" denotes the direction of gravity with respect to the reference. In addition, "above" denotes a position in the direction opposite to the gravity direction with respect to the reference, and "upward" denotes the direction opposite to the gravity direction with respect to the reference. In addition, "vertical direction" is the direction of gravity.

In addition, in this specification, "process gas" is a generic name of gases used for forming a film on a substrate and is a concept including, for example, a source gas, a carrier gas, a dilution gas, and the like.

First Embodiment

A vapor phase growth method according to a first embodiment includes loading a first substrate into a reaction chamber; generating a first mixed gas by mixing an indium containing gas, an aluminum containing gas, and a nitrogen compound containing gas; and forming a first indium aluminum nitride film on the first substrate by supplying the first mixed gas into the reaction chamber, the first substrate being rotated at a first rotation speed of 300 rpm or more. Furthermore, the vapor phase growth method includes generating a second mixed gas by mixing at least a gallium containing gas and the nitrogen-compound containing gas; and forming a first gallium-containing nitride film on the first substrate by supplying the second mixed gas into the reaction chamber, the first substrate being rotated at a second rotation speed of 300 rpm or more. The forming the first indium aluminum nitride film is continuously conducted without unloading the first substrate from the reaction chamber after the forming the first gallium-containing nitride film.

FIG. 1 is a schematic cross-sectional view of a vapor phase growth apparatus used in the vapor phase growth method according to the first embodiment. The vapor phase growth apparatus according to the first embodiment is, for example, a single wafer type epitaxial growth apparatus using metal organic chemical vapor deposition (MOCVD).

The vapor phase growth apparatus according to the first embodiment includes a reaction chamber 10, a first gas supply path 11, a second gas supply path 12, and a third gas supply path 13. The reaction chamber 10 includes a holder 15, a rotator unit 16, a rotation shaft 18, a rotation driving mechanism 19, a gas supply port 20, a mixed gas chamber 21, a shower plate 22, an in-heater 24, an out-heater 26, a reflector 28, a support column 34, a fixed base 36, a fixed shaft 38, and a gas discharge port 40.

The first gas supply path 11, the second gas supply path 12, and the third gas supply path 13 are connected to the gas supply port 20 and supply the process gas to the mixed gas chamber 21.

The first gas supply path 11 supplies, for example, a first process gas containing an organic metal of a group III element and a carrier gas to the reaction chamber 10. A plurality of the first gas supply paths 11 can be provided. In addition, the plurality of first gas supply paths 11 may be unified. The first process gas is a gas containing a group III element for forming a group III-V semiconductor film on a wafer.

The Group III elements are, for example, gallium (Ga), aluminum (Al), indium (In). In addition, the organic metal is, for example, trimethyl gallium (TMG), trimethyl aluminum (TMA), trimethyl indium (TMI).

The second gas supply path 12 supplies a second process gas containing a nitrogen compound as a source of nitrogen (N) to the reaction chamber 10. The nitrogen compound is, for example, ammonia ($NH_3$). The second process gas is a source gas of a group V element for forming a group III-V semiconductor film on a wafer. The group V element is nitrogen (N).

In addition, the nitrogen compound may be an active nitrogen compound. But not limited to ammonia, a gas containing other nitrogen compounds such as hydrazine, alkylhydrazine, alkylamine and the like may be used.

The third gas supply path 13 supplies, for example, a third process gas as a dilution gas for diluting the first process gas and the second process gas to the reaction chamber 10. By diluting the first process gas and the second process gas with the dilution gas, the concentrations of the group III element and the group V element supplied to the reaction chamber 10 are adjusted. The dilution gas is, for example, a hydrogen gas, a nitrogen gas, an inert gas such as an argon gas or a mixed gas thereof.

The first gas supply path 11, the second gas supply path 12, and the third gas supply path 13 join in front of the gas supply port 20. Therefore, the first process gas, the second process gas, and the third process gas are mixed in front of the gas supply port 20 to become a mixed gas. The mixed gas of the first process gas, the second process gas, and the third process gas is supplied from the gas supply port 20 to the mixed gas chamber 21.

In addition, the mixing of the process gases is not always necessarily performed in the pipe on the upstream side of the mixed gas chamber 21. Several process gas pipes may be individually connected to the mixed gas chamber 21, and the mixing of the process gases may be performed in the mixed gas chamber 21.

By mixing the process gas and ejecting the mixed process gas from the shower plate 22 to the reaction chamber 10, the flow rate and the density of the gas ejected from each gas ejection hole are maintained uniform, so that the gas flow inside the reaction chamber 10 tends to become a laminar flow. For this reason, it is considered that substances adhering to the surface of the shower plate 22 are unlikely to be generated.

The reaction chamber 10 is provided with, for example, a cylindrical wall surface 17 made of stainless steel. The shower plate 22 is provided above the reaction chamber 10. The shower plate 22 is provided between the reaction chamber 10 and the mixed gas chamber 21.

The shower plate 22 is provided with a plurality of gas ejection holes. The mixed gas of the process gas is supplied into the reaction chamber 10 from the mixed gas chamber 21 through a plurality of gas ejection holes.

Furthermore, the surface of the wafer W and the shower plate 22 are separated by 3 cm or more from each other. Since the interval between the surface of the wafer W and the shower plate 22 is wide, the process gas that has reached the surface of the wafer W hardly returns to the shower plate 22 side again, and the reaction products are prevented from adhering to the surface of the shower plate 22. In other words, since the interval between the surface of the wafer W and the shower plate 22 is wide, a turbulent flow is unlikely to be generated between the surface of the wafer W and the shower plate 22, and adhesion of reaction products to the surface of the shower plate 22 is suppressed.

Since reaction products are unlikely to adhere to the surface of the shower plate 22 facing the surface of the wafer W, unintentional Ga incorporation into the InAlN film is suppressed. In addition, surface defects caused by falling of the reaction products adhering to the shower plate 22 onto the surface of the wafer W are unlikely to be generated. Therefore, a high-quality film with low defect density is formed.

The distance between the surface of the wafer W and the shower plate 22 is preferably 3 cm or more and 20 cm or less, more preferably 5 cm or more and 15 cm or less. If the distance is below the above-mentioned range, there is a concern that the process gas that has reached the surface of the wafer W returns to the shower plate 22 side again, and reaction products may adhere to the surface of the shower plate 22. In addition, if the distance exceeds the above-mentioned range, thermal convection occurs inside the reaction chamber 10, and thus, there is a concern that the uniformity of the film thickness and the uniformity of the film quality of the film 50 formed on the surface of the wafer W may decrease.

In addition, with respect to the gas ejection holes provided on the surface of the shower plate 22, the interval between the closest ejection holes is preferably 1 mm or more and 15 mm or less. The interval is more preferably 3 mm or more and 10 mm or less. In addition, in some cases, unevenness may be provided on the gas ejection surface of the shower plate to stabilize the gas flow ejected from the shower plate 22. However, if the unevenness becomes too large, the reaction product adheres to the surface of the shower plate 22, which is not preferable. The preferable unevenness on the surface of the shower plate 22 is such that the angle between the surface of the uneven portion and the horizontal direction is 45 degrees or less. The angle is more preferably 30 degrees or less, and most preferably 20 degrees or less.

In addition, the height difference (the difference of distance in the vertical direction between the uppermost portion and the lowermost portion) of the gas ejection hole on the gas ejection surface of the shower plate 22 is preferably 15 mm or less. The height difference is more preferably 10 mm or less, and most preferably 5 mm or less. In a case where the height difference is larger than these values, deposits are generated on the surface of the shower plate 22, and thus, the surface defect concentration increases at the time of film formation.

The holder 15 is provided inside the reaction chamber 10. On the holder 15, a wafer W as an example of a substrate can be mounted. The holder 15 is, for example, in a ring shape. The holder 15 is provided with an opening at the center thereof. Such a ring-shaped holder 15 can be used when an opaque substrate such as a Si substrate is used, and high in-plane uniformity can be obtained. In addition, the shape of the holder 15 may be a substantially flat plate shape having no cavity at the center thereof.

The holder 15 is formed by using, for example, ceramics such as silicon carbide (SiC), tantalum carbide (TaC), boron nitride (BN), or pyrolytic graphite (PG) or carbon as a base material. As the holder 15, for example, carbon coated with SiC, BN, TaC, PG, or the like can be used.

The holder 15 is fixed to the upper portion of the rotator unit 16. The rotator unit 16 is fixed to the rotation shaft 18. The holder 15 is indirectly fixed to the rotation shaft 18.

The rotation shaft 18 is rotatable by the rotation driving mechanism 19. It is possible to rotate the holder 15 by rotating the rotation shaft by the rotation driving mechanism 19. By rotating the holder 15, it is possible to self-rotate the wafer W mounted on the holder 15 at a high speed. The self-rotation denotes that the wafer W rotates about the normal line passing through the approximate center of the wafer W as the rotation axis.

For example, the wafer W is self-rotated at a rotation speed of 300 rpm or more and 3000 rpm or less. The rotation driving mechanism 19 is configured with, for example, a motor and a bearing.

The in-heater 24 and the out-heater 26 are provided below the holder 15. The in-heater 24 and the out-heater 26 are provided in the rotator unit 16. The out-heater 26 is provided between the in-heater 24 and the holder 15.

The in-heater 24 and the out-heater 26 heat the wafer W held by the holder 15. The in-heater 24 heats at least the central portion of the wafer W. The out-heater 26 heats the holder 15 and the outer peripheral region of the wafer W. The in-heater 24 is, for example, in a disk shape. The out-heater 26 is, for example, in a ring shape.

The reflector 28 is provided below the in-heater 24 and the out-heater 26. The in-heater 24 and the out-heater 26 are provided between the reflector 28 and the holder 15.

The reflector 28 reflects the heat radiated downward from the in-heater 24 and the out-heater 26 so as to improve the heating efficiency of the wafer W. In addition, the reflector 28 prevents members below the reflector 28 from being heated. The reflector 28 is, for example, in a disk shape.

The reflector 28 is made of a material having high heat resistance. The reflector 28 has heat resistance to a temperature of, for example, 1100° C. or more.

The reflector 28 is formed by using, for example, ceramics such as SiC, TaC, carbon, BN, or PG or a metal such as tungsten as a base material. In the case of using ceramics for the reflector 28, a sintered body or a base material produced by vapor phase growth can be used. As the reflector 28, a carbon base material or the like coated with ceramics such as SiC, TaC, BN, PG, or glassy carbon may be used.

The reflector 28 is fixed to the fixed base 36 by, for example, a plurality of the support columns 34. The fixed base 36 is supported by, for example, the fixed shaft 38.

A push-up pin (not illustrated) is provided in the rotator unit 16 in order to detach the wafer W from the holder 15. The push-up pin penetrates, for example, the reflector 28 and the in-heater 24.

The gas discharge port 40 is provided at the bottom of the reaction chamber 10. The gas discharge port 40 discharges the surplus reaction product after the reaction of the process gas on the surface of the wafer W and the surplus process gas to the outside of the reaction chamber 10.

In addition, a wafer gateway and a gate valve (not illustrated) are provided to the wall surface 17 of the reaction chamber 10. The wafer W can be loaded into the reaction chamber 10 or unloaded from the reaction chamber 10 by the wafer gateway and gate valves.

Next, the vapor phase growth method according to the first embodiment will be described. In the vapor phase growth method according to the first embodiment, an epitaxial growth apparatus illustrated in FIG. 1 is used.

Hereinafter, a case where the indium aluminum nitride film (InAlN film) is continuously formed on the gallium nitride film (GaN film) will be described as an example. For example, the GaN film is used as a channel layer of the HEMT, and the InAlN film is used as a barrier layer of the HEMT. In addition, the band gap of the material of the barrier layer of the HEMT is larger than the band gap of the material of the channel layer.

Hereinafter, a case where the channel layer is gallium nitride will be described as an example. However, it is also possible to apply a gallium nitride based film formed based on a mixed gas generated by mixing an indium containing gas and an aluminum containing gas with a gas containing gallium and a gas containing ammonia for the channel layer. Specifically, the channel layer can be configured with an InGaN film, an AlGaN film, or the like.

Figure 2:
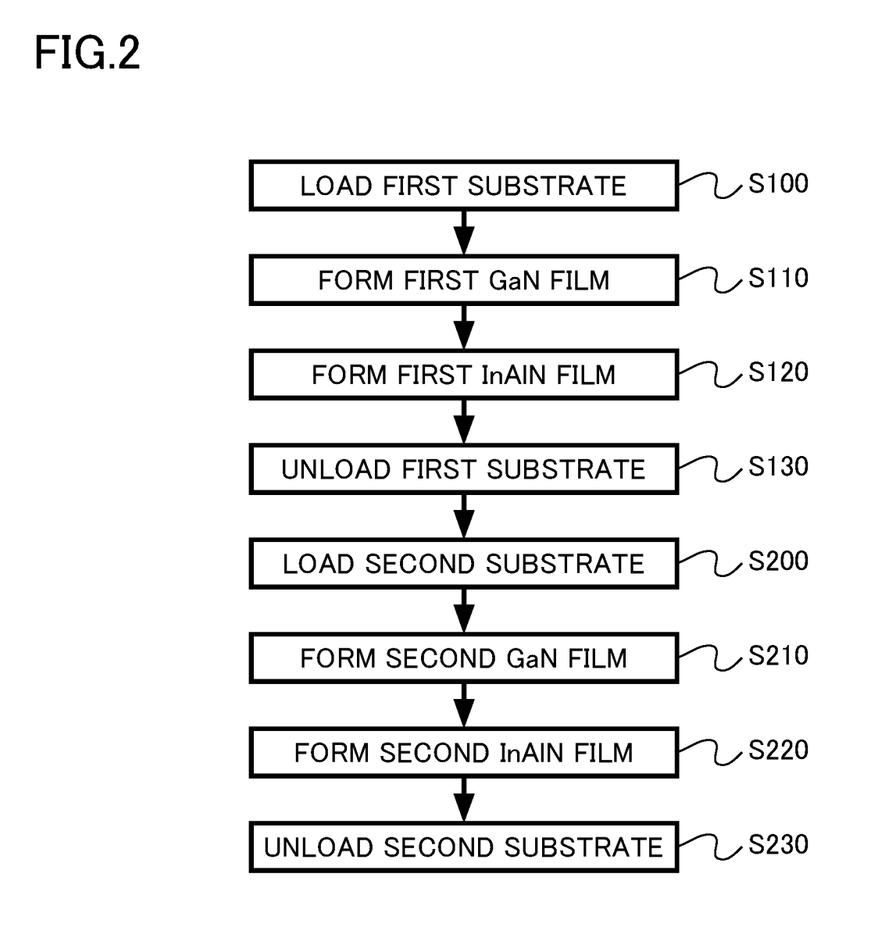
FIG. 2 is a view illustrating process steps of the vapor phase growth method according to the first embodiment.

FIG. 2 is a view illustrating process steps of the vapor phase growth method according to the first embodiment. The vapor phase growth method according to the first embodiment includes a first substrate loading step (S100), a first GaN film forming step (S110), a first InAlN film forming step (S120), a first substrate unloading step (S130), a second substrate loading step (S200), a second GaN film forming step (S210), a second InAlN film forming step (S220), and a second substrate unloading step (S230).

First, the first wafer W (first substrate) is loaded into the reaction chamber 10 (S100). The first wafer W is a silicon substrate of which surface is a {111} plane. The error of the plane orientation of the first wafer W is preferably 3 degrees or less, and more preferably 2 degrees or less. The thickness of the silicon substrate is, for example, 700 μm or more and 1.2 mm or less. In addition, the {111} plane represents a plane crystallographically equivalent to the (111) plane.

Next, the first wafer W is mounted on the holder 15. Next, while self-rotating the first wafer W by the rotation driving mechanism 19, the first wafer W is heated by the in-heater 24 and the out-heater 26 provided below the holder 15.

Next, buffer layers of aluminum nitride (AlN) layer and aluminum gallium nitride (AlGaN) layer are formed on the first wafer W by using TMA, TMG, and ammonia.

Next, a first GaN film is formed on the first wafer W (S110). The first GaN film is a single crystal. The thickness of the first GaN film is, for example, 100 nm or more and 10 μm or less.

At the time of forming the first GaN film, the first wafer W is rotated at a predetermined rotation speed (second rotation speed). The second rotation speed is, for example, 500 rpm or more and 1,500 rpm or less. In addition, the temperature of the first wafer W is, for example, 1,000° C. or more and 1,100° C. or less.

At the time of forming the first GaN film, for example, TMG using nitrogen gas as a carrier gas is supplied from the first gas supply path 11. In addition, ammonia is supplied from the second gas supply path 12. In addition, for example, nitrogen gas as a dilution gas is supplied from the third gas supply path 13.

The TMG containing nitrogen gas as a carrier gas, the ammonia, and the nitrogen gas are mixed to generate a mixed gas (second mixed gas), and the mixed gas is supplied to the mixed gas chamber 21. The mixed gas is supplied from the mixed gas chamber 21 through the shower plate 22 into the reaction chamber 10.

The mixed gas becomes a laminar flow in a direction substantially perpendicular to the surface of the first wafer W in the reaction chamber 10 and is supplied to the surface of the first wafer W. The mixed gas supplied to the surface of the first wafer W flows toward the outer periphery of the first wafer W along the surface of the rotating first wafer W. By a chemical reaction of the mixed gas, the first GaN film is formed on the first wafer W.

Next, a first InAlN film is formed on the first wafer W without unloading the first wafer W from the reaction chamber 10 (S120). The first InAlN film is a single crystal. The film thickness of the first InAlN film is, for example, 5 nm or more and 30 nm or less. The film thickness of the first InAlN film is, for example, smaller than the film thickness of the first GaN film.

The In composition of the first InAlN film is, for example, about 17 atom %. The In composition indicates a ratio of indium occupied to the group III element in the first InAlN film.

At the time of forming the first InAlN film, the first wafer W is rotated at a predetermined rotation speed (first rotation speed). The first rotation speed is, for example, 1,600 rpm or more and 1,800 rpm or less. The first rotation speed is, for example, higher than the second rotation speed. The temperature of the first wafer W is, for example, 700° C. or more and 900° C. or less.

At the time of forming the first InAlN film, for example, TMI using nitrogen gas as a carrier gas is supplied from the first gas supply path 11. In addition, for example, TMA using nitrogen gas as a carrier gas is supplied from the first gas supply path 11. In addition, ammonia is supplied from the second gas supply path 12. In addition, for example, nitrogen gas as a dilution gas is supplied from the third gas supply path 13.

The TMI using nitrogen gas as a carrier gas, the TMA using nitrogen gas as a carrier gas, the ammonia, and the nitrogen gas are mixed to generate a mixed gas (first mixed gas), and the mixed gas is supplied to the mixed gas chamber 21. The mixed gas is supplied from the mixed gas chamber 21 through the shower plate 22 into the reaction chamber 10.

The mixed gas becomes a laminar flow in a direction substantially perpendicular to the surface of the first wafer W in the reaction chamber 10 and is supplied to the surface of the first wafer W. The mixed gas supplied to the surface of the first wafer W flows toward the outer periphery of the first wafer W along the surface of the rotating first wafer W. By a chemical reaction of the mixed gas, a first InAlN film is formed on the first wafer W.

Next, the first wafer W (first substrate) is unloaded from the reaction chamber 10 to the outside (S130).

Next, the second wafer W (second substrate) is loaded into the reaction chamber 10 (S200). After unloading the first wafer W from the reaction chamber 10, the second wafer W is loaded into the reaction chamber 10 without performing cleaning (wet cleaning) of the reaction chamber 10. The second wafer W is a silicon substrate similar to the first wafer W.

Next, buffer layers of AlN and AlGaN are formed on the second wafer W under the same process conditions as those of the buffer layers formed on the first wafer W.

Next, a second GaN film is formed on the second wafer W (S210). The second GaN film is a single crystal. The second GaN film is formed under the process conditions similar to those of the first GaN film.

Next, a second InAlN film is formed on the second wafer W without unloading the second wafer W from the reaction chamber 10 (S220). The second InAlN film is a single crystal. The second InAlN film is formed under the process conditions similar to those of the first InAlN film.

At the time of forming the second InAlN film, for example, TMI using nitrogen gas as a carrier gas is supplied from the first gas supply path 11. In addition, for example, TMA using nitrogen gas as a carrier gas is supplied from the first gas supply path 11. In addition, ammonia is supplied from the second gas supply path 12. In addition, for example, nitrogen gas as a dilution gas is supplied from the third gas supply path 13.

The TMI using nitrogen gas as a carrier gas, the TMA using nitrogen gas as a carrier gas, the ammonia, and the nitrogen gas are mixed to generate a mixed gas, and the mixed gas is supplied to the mixed gas chamber 21. The mixed gas is supplied from the mixed gas chamber 21 through the shower plate 22 into the reaction chamber 10.

The mixed gas becomes a laminar flow in a direction substantially perpendicular to the surface of the second wafer W in the reaction chamber 10 and is supplied to the surface of the first wafer W. The mixed gas supplied to the surface of the second wafer W flows toward the outer periphery of the second wafer W along the surface of the rotating first wafer W. By a chemical reaction of the mixed gas, the second InAlN film is formed on the second wafer W.

Next, the second wafer W (second substrate) is unloaded from the reaction chamber 10 to the outside (S230).

Next, the function and effect of the vapor phase growth method according to the first embodiment will be described.

In the vapor phase growth of the InAlN film, unintentional gallium incorporation into the InAlN film becomes a problem. If the gallium is incorporated into the InAlN film, for example, a decrease in 2DEG density and a decrease in electron mobility at the interface between the InAlN and the GaN occur. For this reason, for example, the characteristics of the HEMT using the stacked film of the GaN film and the InAlN film deteriorate. In addition, an uncontrolled amount of gallium is incorporated into the InAlN film, so that the reproducibility of the characteristics of the HEMT is lost.

In particular, in a case where an InAlN film is continuously formed on the GaN film, it is considered that substances containing gallium adhering to the wall surface or the like of the reaction chamber 10 at the time of forming the GaN film is incorporated into the InAlN film. As a method of suppressing unintentional gallium incorporation into the InAlN film, for example, it is considered effective to clean the reaction chamber before forming the InAlN film. However, if the reaction chamber is cleaned before forming the InAlN film, the throughput of the vapor phase growth apparatus greatly decreases.

In the vapor phase growth method according to the first embodiment, a mixed gas is generated by mixing a group III element process gas and a group V element process gas before being supplied to the reaction chamber 10. Then, the mixed gas is supplied into the reaction chamber 10 to form a GaN film or an InAlN film on the wafer. Only one wafer is in the reaction chamber 10. Then, in a state where one wafer self-rotates at a high speed, the GaN film or the InAlN film is formed on the wafer.

According to the vapor phase growth method according to the first embodiment, even in a case where the InAlN film is continuously formed on the GaN film, it is possible to suppress unintentional gallium incorporation into the InAlN film. According to the vapor phase growth method according to the first embodiment, a mixed gas of a group III element process gas and a group V element process gas is generated before being supplied to the reaction chamber 10, so that the occurrence of a turbulent flow in the reaction chamber 10 is suppressed. For this reason, it is considered that, for example, adhesion of substances containing gallium to the wall surface or the like of the reaction chamber 10 is suppressed during the formation of the GaN film. In addition, it is considered that, the occurrence of a turbulent flow in the reaction chamber 10 is suppressed, and thus, the substances containing gallium adhering to the wall surface or the like of the reaction chamber 10 is suppressed from being desorbed into the atmosphere during the formation of the InAlN film.

In addition, it is considered that, the occurrence of a turbulent flow in the reaction chamber 10 is suppressed by the effect of the mixed gas being drawn by the wafer self-rotating at a high speed, and thus, adhesion of the substances containing gallium and detachment of the substances containing gallium to and from the wall surface or the like of the reaction chamber 10 are suppressed. In addition, it is considered that, by self-rotating the wafer at a high speed, the reaction and decomposition of the mixed gas can be restricted to the vicinity of the wafer surface, and thus, adhesion of the substances containing gallium to the wall surface or the like of the reaction chamber 10 is suppressed.

Figure 3:
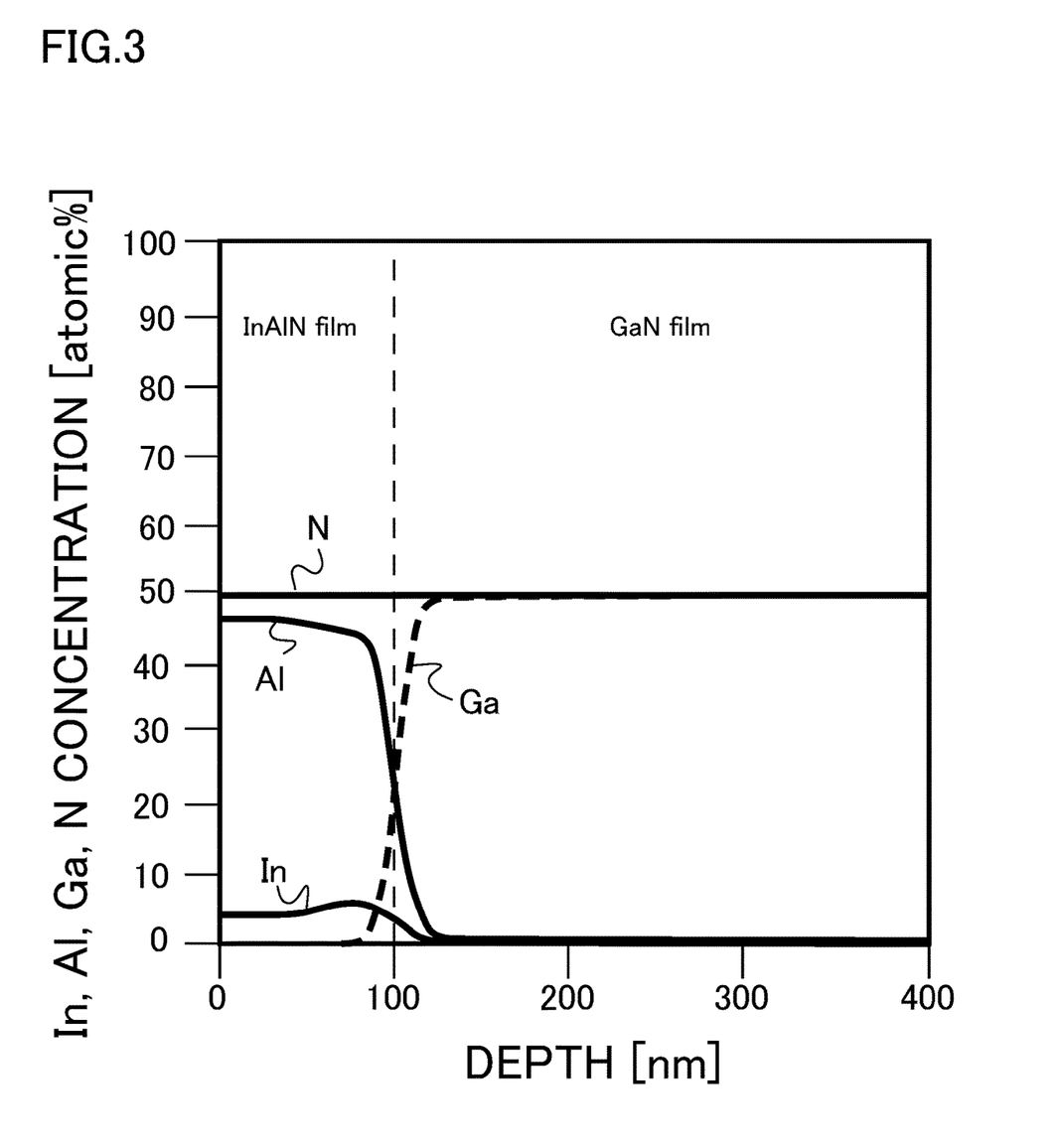
FIG. 3 is an explanatory diagram of effects of the vapor phase growth method according to the first embodiment.

FIG. 3 is an explanatory diagram of the effects of the vapor phase growth method according to the first embodiment. By using the vapor phase growth method according to the first embodiment, the forming of the stacked film including the GaN film was performed 100 times or more without cleaning the reaction chamber 10. FIG. 3 illustrates the depth-directional distribution of indium (In), aluminum (Al), gallium (Ga), and nitrogen (N) in the stacked film of the InAlN film and the GaN film formed without cleaning the reaction chamber 10.

FIG. 3 illustrates analysis results by Rutherford backscattering spectroscopy (RBS). The horizontal axis is the depth based on the surface of the InAlN film, and the vertical axis is the existence ratio of each element. For example, in the case of gallium, the ratio represented by Ga/(In+Al+Ga+N) is indicated by atom %.

The Gallium in the InAlN film was below the detection limit (6 atom %). The same sample was also analyzed by secondary ion mass spectrometry (SIMS), but the gallium in the InAlN film was 1,000 ppm or less.

Therefore, according to the vapor phase growth method according to the first embodiment, it is obvious that, even if the InAlN film is formed without interposing the washing of the reaction chamber 10 after formation of the film containing gallium several times, that unintentional gallium incorporation into the InAlN film does not occur.

In the vapor phase growth method according to the first embodiment, it is preferable that the rotation speed (first rotation speed) of the wafer at the time of forming the InAlN film is higher than the rotation speed (second rotation speed) of the wafer at the time of forming the GaN film.

In a case where the InAlN film is used as a barrier layer of the HEMT, in stabilizing the characteristics of the HEMT, it is important to increase the uniformity of the film thickness of the thin InAlN film and the uniformity of the composition. The uniformity of the film thickness and the uniformity of the composition become higher as the rotation speed of the wafer is higher.

In a case where the GaN film is used as a channel layer of the HEMT, there is a concern that, as the amount of carbon incorporated into the GaN film increases, the 2DEG concentration may decrease and the electron mobility may decrease. Therefore, it is preferable that the amount of carbon in the GaN film is small. The carbon is incorporated into the GaN film from the TMG used for forming the GaN film.

The amount of carbon incorporated into the GaN film increases as the rotation speed of the wafer increases. Therefore, from the viewpoint of suppressing the amount of carbon in the GaN film, it is preferable that the rotation speed of the wafer is low.

By setting the rotation speed (first rotation speed) of the wafer at the time of forming the InAlN film to be higher than the rotation speed (second rotation speed) of the wafer at the time of forming the GaN film, the improvement of the uniformity of the film thickness of the InAlN film and uniformity of the composition and the suppression of the amount of carbon in the GaN film can be compatible with each other.

In addition, in a case where the InAlN film is used as a barrier layer of the HEMT and the GaN film is used as a channel layer of the HEMT, the thickness of the GaN film becomes larger than the thickness of the InAlN film. If film formation of a thick film is performed at a high rotation speed, power consumption used for the film formation increases. Therefore, the production cost for the film formation is increased. Therefore, from the viewpoint of suppressing the production cost, it is also preferable to set the rotation speed (first rotation speed) of the wafer at the time of forming the InAlN film to be higher than the rotation speed (second rotation speed) of the wafer at the time of forming the GaN film. In other words, it is preferable to set the rotation speed (second rotation speed) of the wafer at the time of forming the thick GaN film to be lower than the rotation speed (first rotation speed) of the wafer at the time of forming the thin InAlN film.

It is preferable that the rotation speed (first rotation speed) of the wafer at the time of forming the InAlN film is 1,600 rpm or more and 2,000 rpm or less. If the rotation speed is below the above-mentioned range, there is a concern that the uniformity of the film thickness of the InAlN film and the uniformity of the composition may decrease. If the rotation speed exceeds the above-mentioned range, it becomes difficult to stably control the rotation speed.

It is preferable that the rotation speed (second rotation speed) of the wafer at the time of forming the GaN film is 500 rpm or more and 1,500 rpm or less. If the rotation speed is below the above-mentioned range, there is a concern that the uniformity of the thickness of the GaN film and the uniformity of the composition may decrease. If the rotation speed exceeds the above-mentioned range, there is a concern that the amount of carbon incorporated into the GaN film becomes too large.

From the viewpoint of suppressing unintentional gallium incorporation into the InAlN film, the first rotation speed and the second rotation speed are preferably 300 rpm or more, more preferably 800 rpm or more, still more preferably 1,000 rpm or more.

As described above, according to the vapor phase growth method according to the first embodiment, it is possible to form an InAlN film in which unintentional gallium incorporation is suppressed.

In addition, it is preferable that, after the indium aluminum nitride film is formed and the wafer W is unloaded from the reaction chamber 10, before the next wafer W is processed, deposits adhering to the holder 15 are removed by gas phase etching in the reaction chamber 10. Alternatively, it is preferable to replace the holder 15 to which deposits have adhered with a new holder 15 or a holder 15 from which deposits have been removed outside the reaction chamber. By etching or replacing the holder, it is possible to use a holder to which deposits have not adhered for each growth run, and thus, the initial state of the holder can be maintained to be the same state, so that the film deposition reproducibility is improved. The loading of the holder may be performed at the same time when the wafer W to be processed next is loaded into the reaction chamber 10.

Second Embodiment

The vapor phase growth method according to the second embodiment is similar to the first embodiment except that, after the first gallium nitride film is formed, before the first indium aluminum nitride film is formed, an aluminum nitride film or an aluminum gallium nitride film of which thickness is smaller than the thickness of the first indium aluminum nitride film is formed on the first substrate. Hereinafter, a portion of the redundant description of the first embodiment will be omitted.

Figure 4:
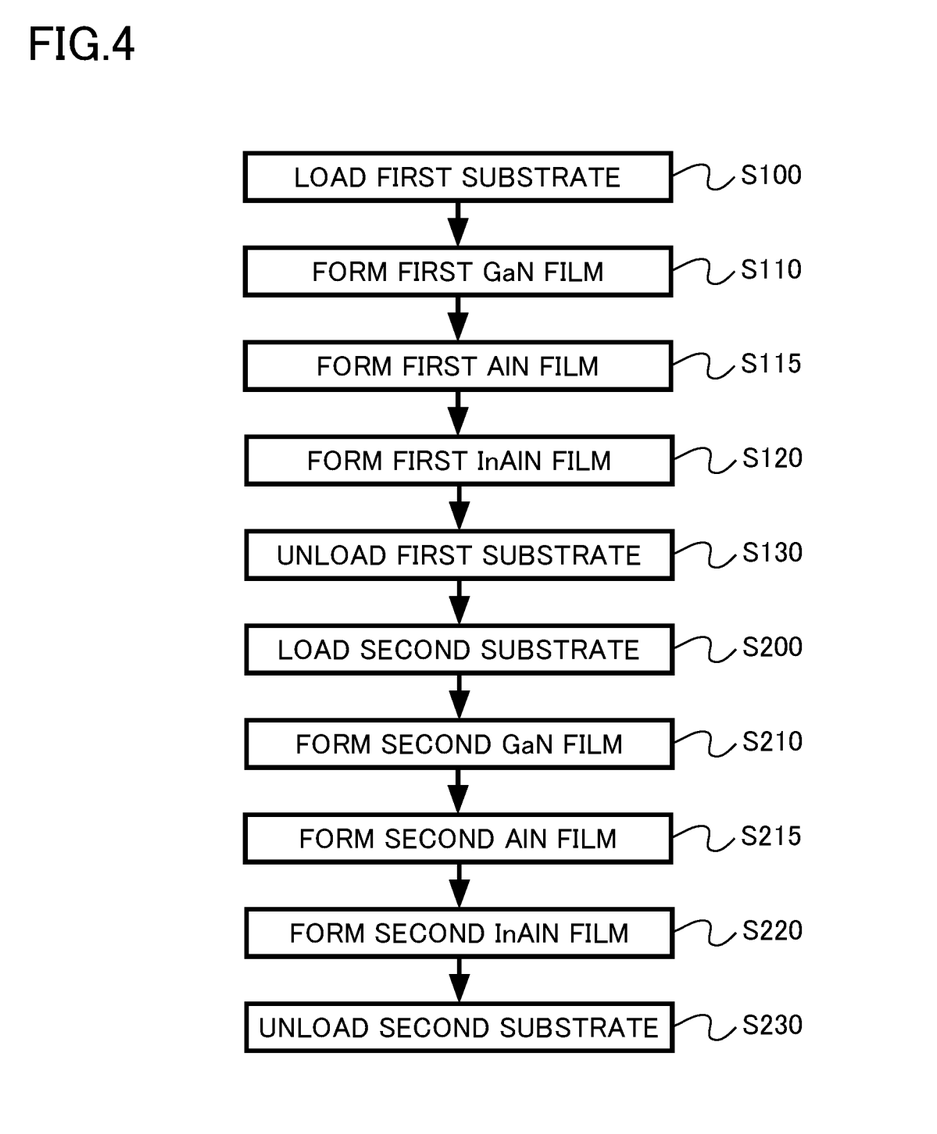
FIG. 4 is a view illustrating process steps of a vapor phase growth method according to a second embodiment.

FIG. 4 is a view illustrating process steps of the vapor phase growth method according to the second embodiment. Hereinafter, a case where an aluminum nitride film is formed after formation of the first gallium nitride film before formation of the first indium aluminum nitride film will be described as an example.

The vapor phase growth method according to the second embodiment includes a first substrate loading step (S100), a first GaN film forming step (S110), a first AlN film forming step (S115), a first InAlN film forming step (S120), a first substrate unloading step (S130), a second substrate loading step (S200), a second GaN film forming step (S210), a second AlN film forming step (S125), a second InAlN film forming step (S220), and a second substrate unloading step (S230).

The steps from the first substrate loading step (S100) to the first GaN film forming step (S110) are similar to those of the first embodiment.

Next, a first AlN film is formed on the first wafer W without unloading the first wafer W from the reaction chamber 10 (S115). The first AlN film is a single crystal. The thickness of the first AlN film is, for example, 0.1 nm or more, preferably 0.3 nm or more and 5 nm or less. The thickness of the first AlN film is smaller than the thickness of the first InAlN film.

At the time of forming the first AlN film, the first wafer W is rotated at a predetermined rotation speed. The rotation speed is, for example, 1,600 rpm or more and 2,000 rpm or less. In addition, the temperature of the first wafer W is, for example, 1,000° C. or more and 1,100° C. or less.

At the time of forming the first AlN film, for example, TMA using nitrogen gas as a carrier gas is supplied from the first gas supply path 11. In addition, ammonia is supplied from the second gas supply path 12. In addition, for example, nitrogen gas as a dilution gas is supplied from the third gas supply path 13.

The TMA using nitrogen gas as a carrier gas, the ammonia, and the nitrogen gas are mixed to generate a mixed gas, and the mixed gas is supplied to the mixed gas chamber 21. The mixed gas is supplied from the mixed gas chamber 21 through the shower plate 22 into the reaction chamber 10.

The mixed gas becomes a laminar flow in a direction substantially perpendicular to the surface of the first wafer W in the reaction chamber 10 and is supplied to the surface of the first wafer W. The mixed gas supplied to the surface of the first wafer W flows toward the outer periphery of the first wafer W along the surface of the rotating first wafer W. By a chemical reaction of the mixed gas, a first AlN film is formed on the first wafer W.

Next, a first InAlN film is formed on the first wafer W without unloading the first wafer W from the reaction chamber 10 (S120). The first InAlN film forming step (S120) is similar to that of the first embodiment.

Next, the first wafer W (first substrate) is unloaded from the reaction chamber 10 to the outside (S130).

Next, the second wafer W (second substrate) is loaded into the reaction chamber 10 (S200). The steps from the second substrate loading step (S200) to the second GaN film forming step (S120) are similar to those of the first embodiment.

Next, a second AlN film is formed on the second wafer W without unloading the second wafer W from the reaction chamber 10 (S215). The second AlN film is a single crystal. The second AlN film is formed under the process conditions similar to those of the first AlN film.

Next, a second InAlN film is formed on the second wafer W without unloading the second wafer W from the reaction chamber 10 (S220). The second InAlN film forming step (S220) is similar to that of the first embodiment.

Next, the second wafer W (second substrate) is unloaded from the reaction chamber 10 to the outside (S230).

Next, the function and effect of the vapor phase growth method according to the second embodiment will be described.

According to the vapor phase growth method according to the second embodiment, similarly to the vapor phase growth method according to the first embodiment, it is possible to suppress unintentional gallium incorporation into the InAlN film.

In addition, similarly to the first embodiment, it is preferable that, after the indium aluminum nitride film is formed and the wafer W is unloaded from the reaction chamber 10, before the next wafer W is processed, the deposits adhering to the holder 15 are removed by vapor phase etching in the reaction chamber. Alternatively, it is preferable to replace the holder 15 to which the deposits have adhered with a new holder 15 or a holder 15 from which the deposits have been removed outside the reaction chamber 10. The loading of the holder may be performed at the same time when the wafer W to be processed next is loaded into the reaction chamber 10.

In a case where the InAlN film is used as a barrier layer of the HEMT and the GaN film is used as a channel layer of the HEMT, by interposing a thin AlN film or AlGaN film between the InAlN film and the GaN film, electron scattering is suppressed, and electron mobility is improved. Therefore, according to the vapor phase growth method according to the second embodiment, it is possible to form a stacked film suitable for application to the HEMT.

As described above, according to the vapor phase growth method according to the second embodiment, it is possible to form an InAlN film in which unintentional gallium incorporation is suppressed. Furthermore, it becomes possible to form a stacked film suitable for application to the HEMT.

Example

After manufacturing the first sample by the vapor phase growth method according to the first embodiment, the following procedure was repeated eight times continuously, and thus, eight samples were manufactured. No cleaning of the reaction chamber 10 is performed from the manufacturing of the first sample to the manufacturing of the eighth sample and during the manufacturing of the above eight samples.

While manufacturing the above 8 samples, in a state where the dummy wafer was mounted on the holder 15, the inside of the reaction chamber 10 was heated to remove substances adhering on the holder 15 after the manufacturing of each sample. After the holder 15 was unloaded from the reaction chamber 10, the 6-inch silicon wafer W was mounted on the holder 15, and the holder 15 and the wafer W were loaded into the reaction chamber 10.

Similarly to the second embodiment, after the AlN film and the AlGaN film as buffer layers were grown on the wafer W in the procedure similar to that of the second embodiment, a GaN channel layer, an AlN film (designed film thickness of 1 nm), an InAlN barrier layer (designed film thickness of 10 nm) were grown. However, at the time of growing the buffer layers, the channel layer, and the AlN film on the channel layer, a mixed gas of hydrogen and nitrogen was used as a carrier gas. In addition, at the time of growing the InAlN barrier layer, nitrogen gas was used as a carrier gas.

Cloudiness of the surface was not observed in any of the eight wafers manufactured in this manner, and it was confirmed that a high-quality film was formed. For the eight wafers, the film thickness distribution of the InAlN in the radial direction (radii of 0, 20, 40, 60, and 70 mm) was evaluated by X-ray diffraction. The average value of the film thickness of the InAlN film of each wafer was 10 nm±0.2 nm. The average value for all the measurement points (40 points) of the eight wafers was 9.89 nm, and the standard deviation was 0.2 nm.

Surface defects were evaluated for these eight wafers (SurfScan 6420 produced by KLA-Tencor). Except for 5 mm around the wafer, the number of defects per wafer was 100 or less (defect size was 0.7 μm or more).

The above results indicate that a high-quality InAlN film is grown with good reproducibility.

Heretofore, the embodiments of the invention have been described with reference to specific examples. The above-described embodiments are merely provided as examples and do not limit the invention. In addition, the constituent elements of the embodiments may be appropriately combined.

In addition, in the embodiments, the case where the process gas is mixed before entering the mixed gas chamber 21 has been described as an example, but the process gas may be configured so as to be mixed in the mixed gas chamber 21.

In addition, in the embodiments, the case where two types of the heaters including the in-heater 24 and the out-heater 26 are provided has been described as an example, but only one type of heater may be used.

In addition, although the reaction chamber for single wafer processing in which the substrates are processed one by one in the film formation has been described as an example, the invention is also applicable to a case where a large number of wafers are mounted on a susceptor and a film formation process is performed at the same time.

In the embodiments, descriptions of portions that are not directly required for description of the invention, such as apparatus configuration and manufacturing method, are omitted, but necessary apparatus configuration, manufacturing method, and the like can be appropriately selected and used. In addition, all the vapor phase growth methods which are equipped with the elements of the invention and can be appropriately designed and changed by those skilled in the art are included in the scope of the invention. The scope of the invention is defined by the claims and the scope of equivalents thereof.

What is claimed is:

1. A vapor phase growth method comprising:
   loading a first substrate into a reaction chamber;
   generating a first mixed gas by mixing at least a gallium containing gas and a nitrogen-compound containing gas;
   forming a first gallium-containing nitride film after the loading the first substrate by supplying the first mixed gas into the reaction chamber, the first substrate being rotated at a first rotation speed of 300 rpm or more;
   forming an aluminum nitride film or an aluminum gallium nitride film after the forming the first gallium-containing nitride film;
   generating a second mixed gas by mixing an indium containing gas, an aluminum containing gas, and a nitrogen compound containing gas; and
   forming a first indium aluminum nitride film after the forming the aluminum nitride film or the aluminum gallium nitride film by supplying the second mixed gas into the reaction chamber, the first substrate being rotated at a second rotation speed of 300 rpm or more, and the forming the first indium aluminum nitride film being continuously conducted without unloading the first substrate from the reaction chamber after the forming the first gallium-containing nitride film,
   wherein a thickness of the aluminum nitride film or the aluminum gallium nitride film is smaller than a thickness of the first indium aluminum nitride film.

2. The vapor phase growth method according to claim 1, wherein the reaction chamber is a reaction chamber for single wafer processing, and a rotation of the first substrate is self-rotation.

3. The vapor phase growth method according to claim 1, further comprising:
   unloading the first substrate from the reaction chamber after the forming the first indium aluminum nitride film;
   loading a second substrate into the reaction chamber without cleaning the reaction chamber;
   forming a second gallium-containing nitride film after the loading the second substrate by supplying the first mixed gas into the reaction chamber, the second substrate being rotated at the first rotation speed of 300 rpm or more; and
   forming a second indium aluminum nitride film after the forming the second gallium-containing nitride film by supplying the second mixed gas into the reaction chamber, the second substrate being rotated at the second rotation speed of 300 rpm or more.

4. The vapor phase growth method according to claim 1, wherein the nitrogen compound is ammonia.

5. The vapor phase growth method according to claim 1, wherein the first substrate is a silicon substrate.

6. The vapor phase growth method according to claim 1, wherein the aluminum nitride film or the aluminum gallium nitride film has a film thickness of 0.1 nm or more and 5 nm or less.

7. The vapor phase growth method according to claim 1, wherein the second rotation speed is higher than the first rotation speed.

8. The vapor phase growth method according to claim 7, wherein the second rotation speed is 1,600 rpm or more and the first rotation speed is 1,500 rpm or less.

* * * * *